United States Patent
Sugahara et al.

(10) Patent No.: US 8,198,637 B2
(45) Date of Patent: Jun. 12, 2012

(54) NITRIDE SEMICONDUCTOR LASER AND METHOD FOR FABRICATING THE SAME

(75) Inventors: Gaku Sugahara, Nara (JP); Yasutoshi Kawaguchi, Suita (JP); Akihiko Ishibashi, Mishima-gun (JP); Isao Kidoguchi, Kawanishi (JP); Toshiya Yokogawa, Nara (JP)

(73) Assignee: Panasonic Corporation, Osaka (JP)

( * ) Notice: Subject to any disclaimer, the term of this patent is extended or adjusted under 35 U.S.C. 154(b) by 855 days.

(21) Appl. No.: 11/872,071

(22) Filed: Oct. 15, 2007

(65) Prior Publication Data

US 2008/0049806 A1    Feb. 28, 2008

Related U.S. Application Data

(63) Continuation of application No. 10/547,968, filed as application No. PCT/JP2004/003042 on Mar. 9, 2004, now Pat. No. 7,338,827.

(30) Foreign Application Priority Data

Mar. 25, 2003    (JP) ................. 2003-082400

(51) Int. Cl.
*H01L 27/15*    (2006.01)
(52) U.S. Cl. .......... 257/79; 257/E33.01; 372/43.01
(58) Field of Classification Search .......... 372/43.01, 372/49.01, 46.013, 46.012; 257/E33.001, 257/79
See application file for complete search history.

(56) References Cited

U.S. PATENT DOCUMENTS

| | | | |
|---|---|---|---|
| 6,455,877 B1 | 9/2002 | Ogawa et al. | |
| 6,501,154 B2 | 12/2002 | Morita et al. | |
| 6,613,461 B1 | 9/2003 | Sugahara | |
| 2002/0048302 A1 | 4/2002 | Kimura | |
| 2002/0127856 A1* | 9/2002 | Kunisato et al. | 438/689 |
| 2003/0030053 A1 | 2/2003 | Kawakami et al. | |
| 2004/0094773 A1 | 5/2004 | Kiyoku et al. | |

FOREIGN PATENT DOCUMENTS

| | | |
|---|---|---|
| JP | 05-217904 | 8/1993 |
| JP | 07-038149 | 2/1995 |
| JP | 08-236867 | 9/1996 |
| JP | 09-186404 | 7/1997 |

(Continued)

OTHER PUBLICATIONS

International Search Report for corresponding PCT/JP2004/003042 mailed, Jun. 22, 2004.

(Continued)

*Primary Examiner* — Matthew Reames

(74) *Attorney, Agent, or Firm* — Renner, Otto, Boisselle & Sklar, LLP

(57) ABSTRACT

A semiconductor laser includes a nitride semiconductor substrate with a striped raised portion that extends in a resonant cavity length direction, a masking layer, which has been defined on the principal surface of the nitride semiconductor substrate and which has a striped opening in a selected area on the upper surface of the striped raised portion, and a nitride semiconductor multilayer structure, which has been grown on the selected area on the upper surface of the striped raised portion. The nitride semiconductor multilayer structure is thicker than nitride semiconductors on the masking layer, and the nitride semiconductor multilayer structure is broader in width than the striped opening of the masking layer and includes portions that have grown laterally onto the masking layer.

6 Claims, 7 Drawing Sheets

FOREIGN PATENT DOCUMENTS

| | | |
|---|---|---|
| JP | 10-335750 | 12/1998 |
| JP | 11-330622 | 11/1999 |
| JP | 2001-085736 | 3/2001 |
| JP | 2001-148357 | 5/2001 |
| JP | 2001-176823 | 6/2001 |
| JP | 2002-261370 | 9/2002 |

OTHER PUBLICATIONS

Co-pending U.S. Appl. No. 10/537,868 (claims attached).
Office Action dated Mar. 16, 2010 issued for corresponding Japanese Patent Application No. 2004-062590 and the English translation thereof.

* cited by examiner

101: n-Type GaN Substrate

102: Insulating Film

101: n-Type GaN Substrate

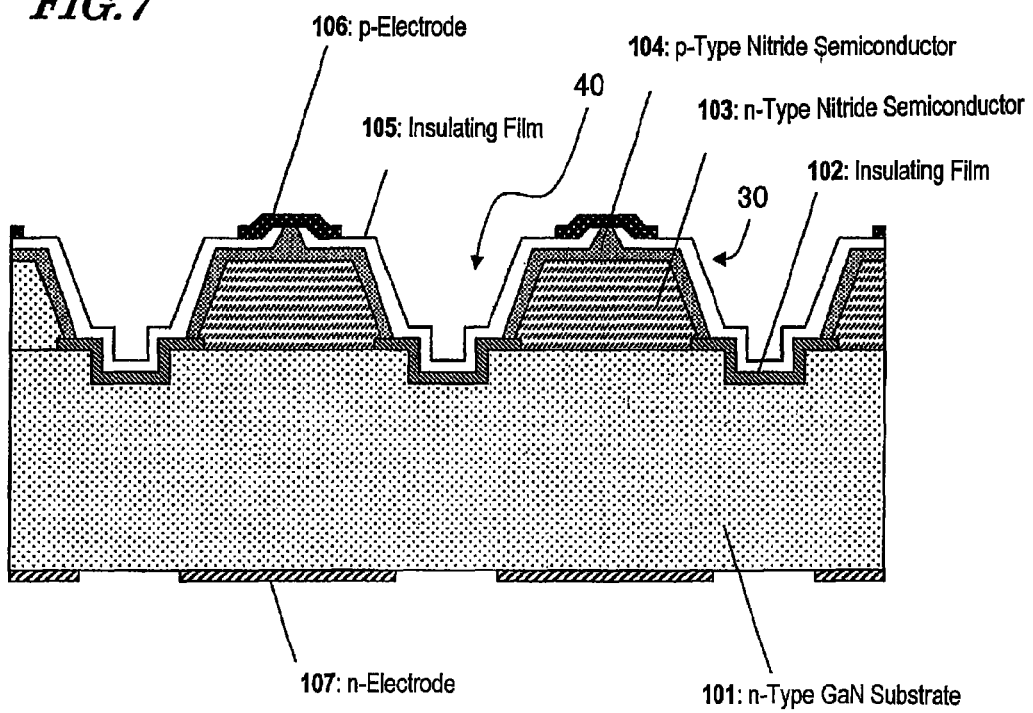
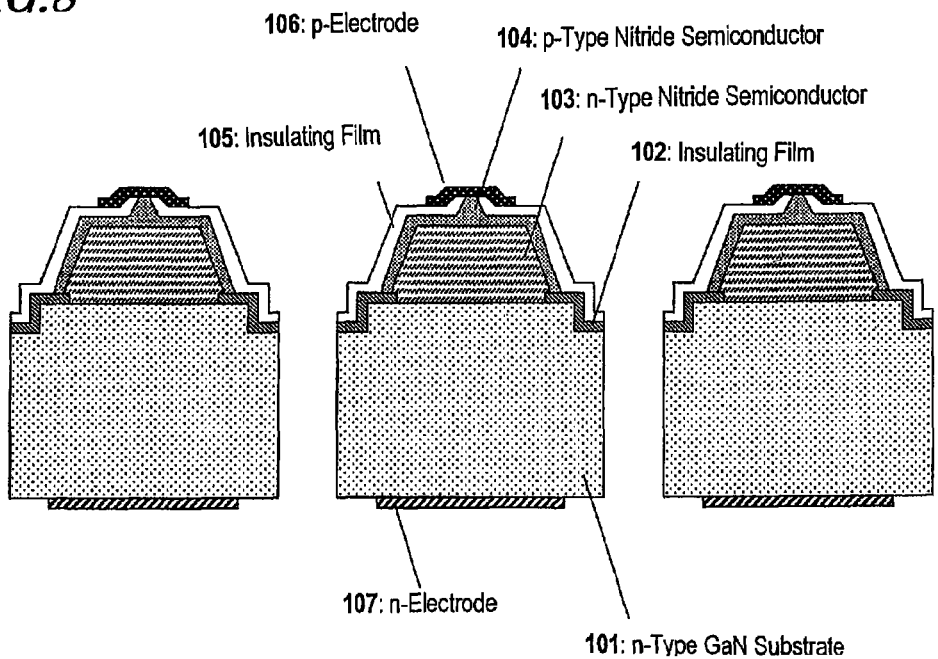

306: p-Electrode
305: Insulating Film
304: p-Type Nitride Semiconductor
303: n-Type Nitride Semiconductor
301: n-Type GaN Substrate
307: n-Electrode

<0001>
<1-100>
<11-20>

301: n-Type GaN Substrate

304: p-Type Nitride Semiconductor
303: n-Type Nitride Semiconductor
301: n-Type GaN Substrate 304: p-Type Nitride Semiconductor
303: n-Type Nitride Semiconductor
301: n-Type GaN Substrate

NITRIDE SEMICONDUCTOR LASER AND METHOD FOR FABRICATING THE SAME

This application is a continuation of U.S. patent application Ser. No. 10/547,968 filed on Sep. 8, 2005, now U.S. Pat. No. 7,338,827, which is a §371 of International Application No. PCT/JP2004/003042 filed Mar. 9, 2004, which is hereby incorporated herein by reference in its entirety.

TECHNICAL FIELD

The present invention relates to a nitride semiconductor device such as a semiconductor laser, which is expected to be applied in the field of optical information processing, and also relates to a method for fabricating such a semiconductor device.

BACKGROUND ART

To increase the storage density of an optical disk, a laser beam for reading and/or writing data from/on it should have a shortened wavelength. Most of DVD players and recorders currently on the market use red semiconductor lasers operating at wavelengths of 660's nm. A red semiconductor laser like this is fabricated by epitaxially growing InGaAlP based compound semiconductors on a GaAs substrate, for example.

Recently, people are spending a lot of time and energy in developing next-generation optical disks that have higher storage densities than DVDs. A light source for each of those next-generation optical disks needs to constantly emit a violet laser beam (falling within the wavelength range of 400's nm), of which the wavelength is even shorter than that of the red ray.

A Group III-V nitride semiconductor, including nitrogen (N) as its Group V element, has a broader bandgap, absorbs or emits light with greater energy, and has a shorter emission wavelength, than a GaAs based semiconductor. In view of this advantage, the nitride semiconductor is expected to be applicable as a material of emitting short-wave light.

Among various nitride semiconductors, a gallium nitride based compound semiconductor (i.e., GaN based semiconductor: $Al_xGa_yIn_zN$, where $0 \leq x, y, z \leq 1$ and $x+y+z=1$) has been researched so extensively as to put blue and green light-emitting diodes (LEDs) on the market. Also, to further increase the capacities of optical disk drives, semiconductor lasers with oscillation wavelengths of 400's nm are in high demand and semiconductor lasers made of GaN based semiconductors have been researched.

However, unlike the GaAs based semiconductor lasers, those GaN based semiconductor lasers have been fabricated on a sapphire substrate or low-dislocation GaN on sapphire, not on a semiconductor substrate. This is because it has been difficult to make a GaN based semiconductor substrate of quality. But the quality of GaN based semiconductor substrates has been improved just recently to the point that people attempt to fabricate a nitride semiconductor device on a GaN based semiconductor substrate.

FIG. 9 is a perspective view illustrating the structure of a conventional semiconductor laser with a multilayer structure on a GaN substrate. Semiconductor lasers of this type are disclosed in Japanese Patent Application Laid-Open Publications Nos. 11-330622 and 2001-148357, for example. Hereinafter, a method for fabricating the semiconductor laser shown in FIG. 9 will be described with reference to FIGS. 10 through 14.

First, an n-type GaN substrate 301 is prepared as shown in FIG. 10. The n-type GaN substrate 301 is made up of hexagonal single crystals and has a principal surface (i.e., the upper surface) that is a (0001) plane.

Next, as shown in FIG. 11, an n-type nitride semiconductor 303 and a p-type nitride semiconductor 304 are deposited on the n-type GaN substrate 301 by a metalorganic chemical vapor deposition (MOCVD) process. The n-type nitride semiconductor 303 includes an n-AlGaN cladding layer and an n-GaN optical guide layer, which are stacked in this order on the n-type GaN substrate 301. On the other hand, the p-type nitride semiconductor 304 includes a $Ga_{1-x}In_xN/Ga_{1-y}In_yN$ (where $0<y<x<1$) multi-quantum well (MQW) active layer, a p-GaN optical guide layer, a p-AlGaN cladding layer and a p-GaN contact layer, which are stacked in this order over the n-type GaN substrate 301.

Next, as shown in FIG. 12, the upper surface of the p-type nitride semiconductor 304 is patterned into a plurality of ridge stripes, each having a width of about 2 μm. FIG. 12 illustrates a cross section as viewed on a plane that is perpendicular to the resonant cavity direction.

Thereafter, as shown in FIG. 13, each of the ridge stripes made of the p-type nitride semiconductor 304 is covered with an insulating film 305 on right- and left-hand sides. In this case, the upper surface of each ridge stripe is exposed through a striped opening of the insulating film 305. Subsequently, p-electrodes 306 of Ni/Au are formed so as to make contact with the p-type nitride semiconductor 304 at the top of the ridge stripes. On the back surface of the substrate 301, n-electrodes 307 of Ti/Au are formed after the back surface has been polished if necessary.

Next, the substrate 301 is subjected to a first cleavage process in the <11-20> direction of the substrate 301, thereby defining resonant cavity facets as (1-100) planes. More particularly, a lot of bars are made out of a single wafer by the first cleavage process. Each bar has resonant cavity facets that are parallel to the paper of FIG. 13. Thereafter, each bar is split into a number of chips by a second cleavage process. More specifically, each bar is subjected to the second cleavage process in the <1-100> direction, thereby splitting the bar into multiple chips as shown in FIG. 14. The <1-100> direction is perpendicular to the (1-100) planes as the resonant cavity facets. The surfaces that are exposed as a result of the second cleavage process are (11-20) planes that cross both the resonant cavity facets and the principal surface of the substrate at right angles.

In operating the device shown in FIG. 9, the n-electrode 307 is grounded and a voltage is applied from a driver (not shown) to the p-electrode 306. Then, holes are injected from the p-electrode 306 toward the MQW active layer, while electrons are injected from the n-electrode 307 toward the MQW active layer. As a result, a population inversion is produced in the MQW active layer to cause an optical gain. Consequently, a laser beam is produced at oscillation wavelengths of 400s nm.

In making semiconductor laser chips by the above method, however, the second cleavage process for splitting each bar into a number of chips often results in a poor yield. This is a problem caused by the crystal structure of a nitride semiconductor substrate of GaN, for example.

Generally speaking, a (1-100) plane of a hexagonal nitride semiconductor is a crystallographic plane that is easy to cleave. However, a (11-20) plane thereof, which crosses the (1-100) plane at right angles, cleaves less easily than the (1-100) plane. For that reason, in order to define resonant cavity facets of quality for a semiconductor laser that uses a GaN substrate, the first cleavage process is usually carried out in the <11-20> direction to define resonant cavity facets as (1-100) planes and then the second cleavage process is carried out in the <1-100> direction for the purpose of chip splitting. In the cleavage process done in the <1-100> direction, however, the substrate often cleaves in a direction that has deviated from the <1-100> direction by 30 degrees, e.g., in a <2-1-10> direction, thus decreasing the yield.

In order to overcome the problems described above, an object of the present invention is to provide a nitride semiconductor device at a high production yield and a method for fabricating such a device.

DISCLOSURE OF INVENTION

A method for fabricating nitride semiconductor devices according to the present invention includes the steps of: (A) providing a nitride semiconductor wafer, which will be split into a plurality of chip substrates, which includes a plurality of device portions that will function as the respective chip substrates when the wafer is split and a plurality of interdevice portions that connect the device portions together, and in which the average thickness of the interdevice portions is smaller than the thickness of the device portions; (B) defining a masking layer, which has striped openings over the device portions, on the upper surface of the nitride semiconductor wafer; (C) selectively growing nitride semiconductor layers on portions of the upper surface of the nitride semiconductor wafer, which are exposed through the openings of the masking layer; and (D) cleaving the nitride semiconductor wafer along the interdevice portions of the nitride semiconductor wafer, thereby forming a plurality of nitride semiconductor devices on the respectively split chip substrates.

In one preferred embodiment, the step (A) includes the steps of: (a1) providing a nitride semiconductor wafer with a flat upper surface; and (a2) cutting grooves on the upper surface of the wafer, thereby making the average thickness of the interdevice portions smaller than the thickness of the device portions.

In another preferred embodiment, the step (a1) includes providing a GaN based compound semiconductor wafer of which the upper surface is a (0001) plane, and the step (a2) includes cutting grooves extending in the <1-100> direction.

In another preferred embodiment, the step (a2) includes the step of cutting the grooves by etching the upper surface of the wafer to a depth of at least 0.1 μm.

In another preferred embodiment, the step (C) includes forming a multilayer structure, including GaN based compound semiconductor layers, by a selective growth process.

In another preferred embodiment, when the cleaving step (D) is carried out, the overall thickness of nitride semiconductor layers deposited on the interdevice portions of the nitride semiconductor wafer is smaller than that of the nitride semiconductor layers deposited on the device portions.

A semiconductor light-emitting device according to the present invention includes: a nitride semiconductor substrate with a striped raised portion that extends in a resonant cavity length direction; a masking layer, which has been defined on the principal surface of the nitride semiconductor substrate and which has a striped opening in a selected area on the upper surface of the striped raised portion; and a nitride semiconductor multilayer structure, which has been grown on the selected area on the upper surface of the striped raised portion. The nitride semiconductor multilayer structure is thicker than nitride semiconductors on the masking layer.

In one preferred embodiment, the nitride semiconductor multilayer structure includes a p-type semiconductor layer and an n-type semiconductor layer.

In another preferred embodiment, the substrate is a GaN based compound semiconductor substrate of which the upper surface is a (0001) plane, and resonant cavity facets thereof are (1-100) planes.

In another preferred embodiment, the raised portion has a width of 50 μm to 500 μm, and the striped opening of the masking layer has a width of 30 μm to 480 μm, which is narrower than the width of the raised portion.

The nitride semiconductor multilayer structure is broader in width than the striped opening of the masking layer and includes portions that have grown laterally onto the masking layer.

In another preferred embodiment, the masking layer covers both side surfaces of the raised portion of the substrate.

In another preferred embodiment, level differences on the right- and left-hand sides of the raised portion on the principal surface of the nitride semiconductor substrate have a height of at least 0.1 μm.

BRIEF DESCRIPTION OF DRAWINGS

FIG. 7 is a cross-sectional view illustrating another processing step for fabricating the nitride semiconductor device shown in FIG. 1.

FIG. 8 is a cross-sectional view illustrating another processing step for fabricating the nitride semiconductor device shown in FIG. 1.

BEST MODE FOR CARRYING OUT THE INVENTION

Hereinafter, preferred embodiments of the present invention will be described in detail with reference to the accompanying drawings.

Figure 1:
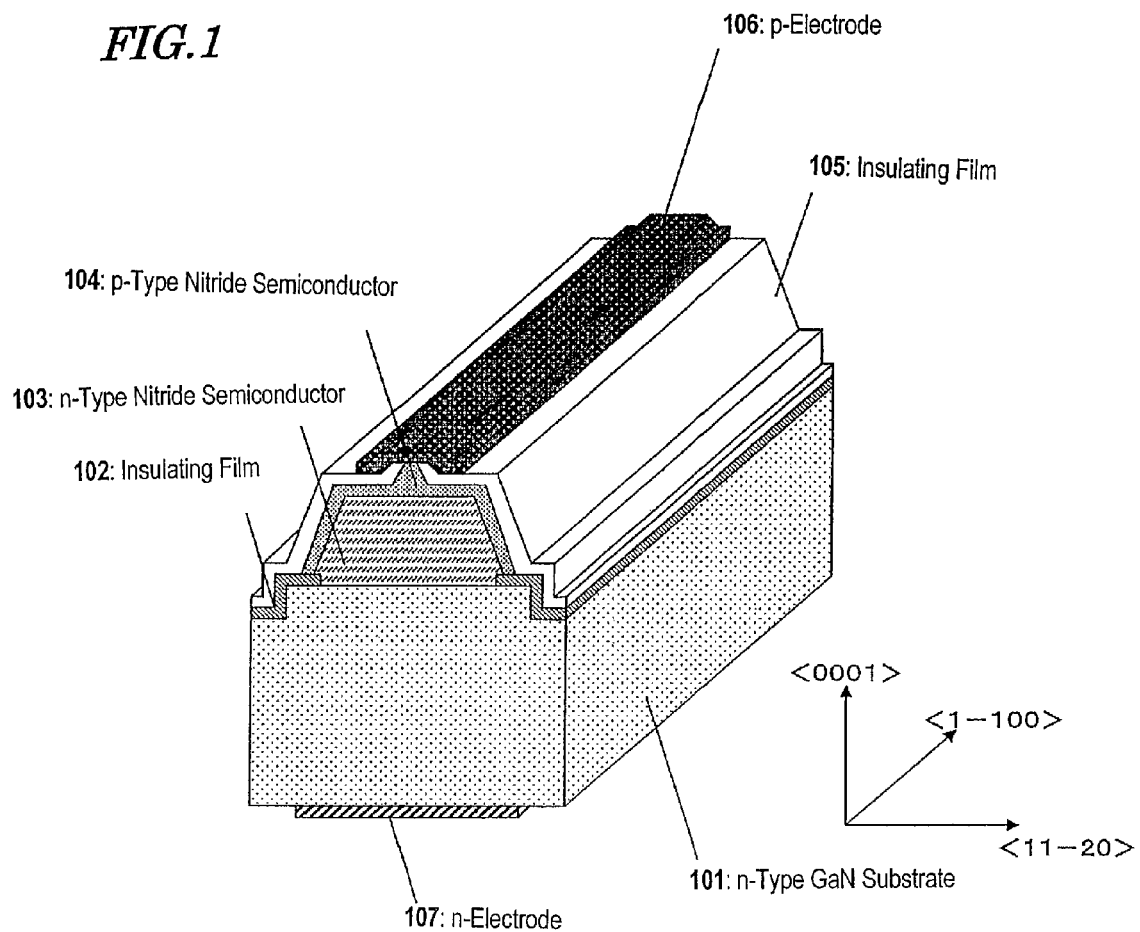
FIG. 1 is a perspective view illustrating the structure of a nitride semiconductor device according to a preferred embodiment of the present invention.

First, referring to FIG. 1, illustrated is a perspective view showing the structure of a nitride semiconductor laser according to a preferred embodiment of the present invention. As shown in FIG. 1, the substrate 101 of this preferred embodiment is made of n-type GaN single crystals with a hexagonal crystal structure. The principal surface (i.e., the upper surface) of the n-type GaN substrate 101 is a (0001) plane. Also, the n-type GaN substrate 101 is obtained by cleaving and splitting a wafer into multiple chips such that the resonant cavity facets become (1-100) planes and that the side surfaces of each device become (11-20) planes.

In this preferred embodiment, an n-type GaN substrate is used as the substrate 101. However, the conductivity type may be inverted depending on the structure of the device. Also, any other nitride semiconductor substrate with a hexagonal crystal structure, such as an AlGaN substrate or an AlN substrate, may also be used.

As shown in FIG. 1, a striped raised portion has been formed on the principal surface of the n-type GaN substrate 101 so as to extend in the resonant cavity length direction that is the <1-100> direction. In a preferred embodiment, this raised portion may have a width of 50 μm to 500 μm, for example. Meanwhile, the resonant cavity length may fall within the range of 400 μm to 800 μm, for example.

The striped raised portion on the principal surface of the n-type GaN substrate 101 is sandwiched between a pair of planes, of which the level is lower than that of the upper surface of the raised portion. That is to say, there is a level difference of 0.1 μm to 10 μm between them. Accordingly, when a resonant cavity facet of the n-type GaN substrate 101 is viewed in the resonant cavity length direction, the n-type GaN substrate 101 is seen to have a raised upper portion.

Also, on the principal surface of the n-type GaN substrate 101, an insulating film 102, functioning as a masking layer for selective growth, has been deposited. The insulating film 102 may be made of a silicon nitride film and has a striped opening in a selected area on the upper surface of the striped raised portion. But the insulating film 102 covers the other areas on the principal surface of the substrate as well. The striped opening may have a width of 30 μm to 480 μm, which is preferably set narrower than the width of the raised portion.

The insulating film 102 may be made of any material as long as nitride semiconductors do not grow easily thereon. But the insulating film 102 is preferably made of silicon nitride, silicon oxynitride, a silicon oxide or an aluminum oxide. Also, the masking layer does not necessarily have electrical insulation property as long as the material thereof provides a mask for selective growth. That is why the masking layer may also be made of a semiconductor or even a metal.

In this preferred embodiment, a nitride semiconductor multilayer structure is provided on the upper surface of the striped raised portion of the n-type GaN substrate 101. As will be described in detail later, this multilayer structure has been grown selectively on the n-type GaN substrate 101, of which the principal surface is partially covered with the insulating film 102. In FIG. 1, the nitride semiconductor laser is illustrated as if no nitride semiconductors had been deposited on the insulating film 102 at all. However, a nitride semiconductor layer may cover the insulating film 102 entirely as long as that layer is thinner than the nitride semiconductor multilayer structure. Depending on the selective growth conditions, nitride semiconductors may grow on the insulating film 102, too. However, such an additional growth is not a problem as long as the thickness of the nitride semiconductors on the insulating film 102 is less than the thickness (or the height) of the nitride semiconductor multilayer structure.

More specifically, the nitride semiconductor multilayer structure that has been formed on the striped raised portion of the n-type GaN substrate 101 includes an n-type nitride semiconductor 103 that has grown on the substrate 101 and a p-type nitride semiconductor 104 that has grown on the n-type nitride semiconductor 103. Each of these nitride semiconductors 103 and 104 further includes a number of nitride semiconductor layers with various compositions.

The upper portion of the p-type nitride semiconductor 104 has been patterned into a ridge stripe shape, which is covered with an insulating film 105 that has an opening at the top of the ridge stripe. Also, a p-electrode 106 is provided so as to make contact with the p-type compound semiconductor 104 at the top of the ridge stripe, while an n-electrode 107 is provided on the back surface of the substrate 101.

The nitride semiconductor multilayer structure may have a broader width than that of the striped opening of the insulating film 102. In the example illustrated in FIG. 1, the nitride semiconductor multilayer structure includes portions that have grown laterally onto the insulating film 102. At the bottom, this multilayer structure may have a width of 40 μm to 490 μm, for example.

In the semiconductor laser shown in FIG. 1, the opening of the insulating film 102 has a constant width in the resonant cavity length direction. Alternatively, the insulating film 102 may also have been patterned such that the width of the opening changes from one position to another. By adjusting the shape, size and location of the opening of the insulating film 102, the shape, size and location of the nitride semiconductor multilayer structure, formed by selective growth, can be controlled. Also, even if the opening of the insulating film 102 has the same pattern, the width of the nitride semiconductor multilayer structure may also be changed by controlling the selective growth conditions.

In the device shown in FIG. 1, the n-electrode 107 is grounded and a voltage is applied to the p-electrode 106. Then, holes are injected from the p-electrode 106 toward an MQW active layer, while electrons are injected from the n-electrode 107 toward the MQW active layer. As a result, an optical gain is caused in the MQW active layer, thereby producing laser radiation at oscillation wavelengths of 400s nm.

Hereinafter, a method for fabricating the semiconductor laser shown in FIG. 1 will be described with reference to FIGS. 2 through 8.

Figure 2:
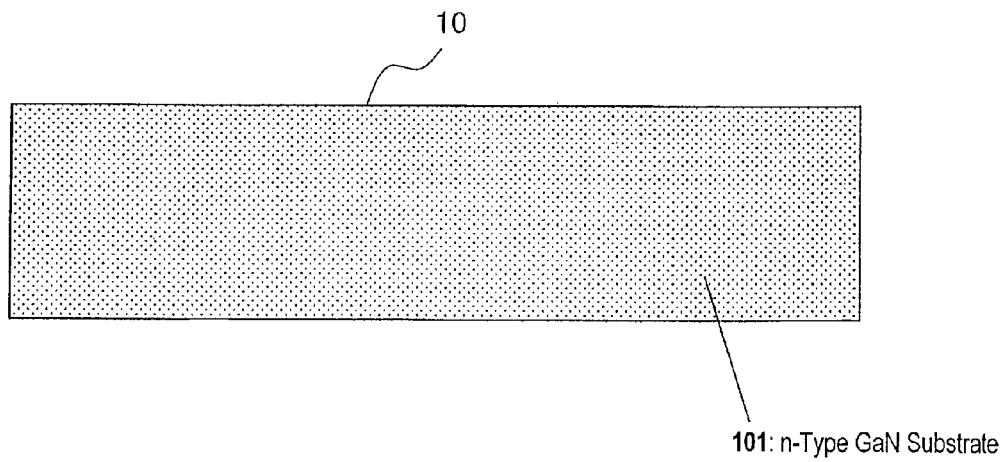
FIG. 2 is a cross-sectional view illustrating a processing step for fabricating the nitride semiconductor device shown in FIG. 1.

First, as shown in FIG. 2, an n-type GaN substrate 101, which has a hexagonal crystal structure and of which the principal surface 10 is a (0001) plane, is prepared. The substrate 101 may have a thickness of 400 μm, for example. At this point in time, the n-type GaN substrate 101 has not been split into chips yet but has a wafer shape with a diameter of about 2 inches, for example. FIG. 2 is a partially enlarged view schematically illustrating a portion of the substrate 101.

Figure 3:
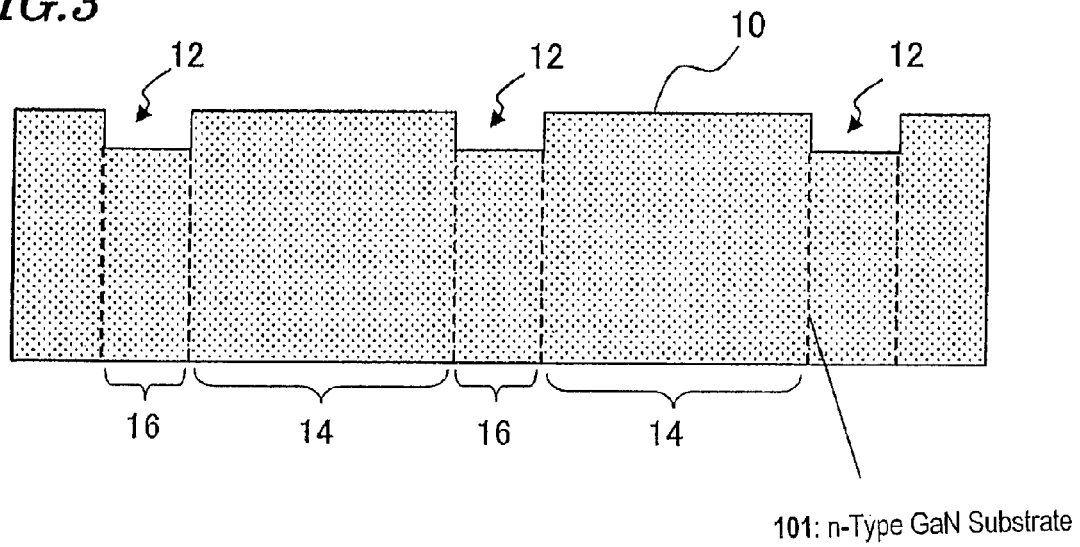
FIG. 3 is a cross-sectional view illustrating another processing step for fabricating the nitride semiconductor device shown in FIG. 1.

Next, as shown in FIG. 3, grooves 12 are cut on the principal surface of the substrate 101. In this preferred embodiment, the grooves 12 may have a width of 50 μm, a depth of 500 nm, and the direction in which the grooves extend (i.e., the direction coming out of the paper of FIG. 2) is the <1-100> direction of the substrate 101 (see FIG. 1). These grooves 12 are made to make the second cleavage process easier. For that purpose, the grooves 12 are cut in interdevice portions 16. Meanwhile, each device portion 14, which will be eventually cut out as a chip substrate from the substrate 101, is located between two adjacent grooves 12.

In this preferred embodiment, the grooves 12 may be arranged at an interval (substantially corresponding to the width of the device portions 14) of 450 μm, for example. The grooves 12 are arranged at regular intervals, and their pitch will define the chip size of each device, which will be eventually cut out from the substrate 101. To make the second cleavage process easy, the depth of the grooves 12 preferably has a lower limit of 0.1 μm or more. On the other hand, the upper limit depth of the grooves 12 is preferably about 10% of the substrate thickness at the beginning of the process. If the depth of the grooves 12 exceeded this percentage of the substrate thickness, then the mechanical strength of the substrate 101 would decrease so much as to possibly damage the substrate 101 during the manufacturing process.

These grooves 12 can be cut easily by defining a resist pattern (not shown) on the principal surface 10 of the substrate 101 by a photolithographic process and then etching the substrate 101 with that resist pattern used as a mask. The grooves 12 are preferably made by a reactive ion etching process, for example. In that case, the depth of the grooves 12 is managed by the etching process time.

Figure 4:
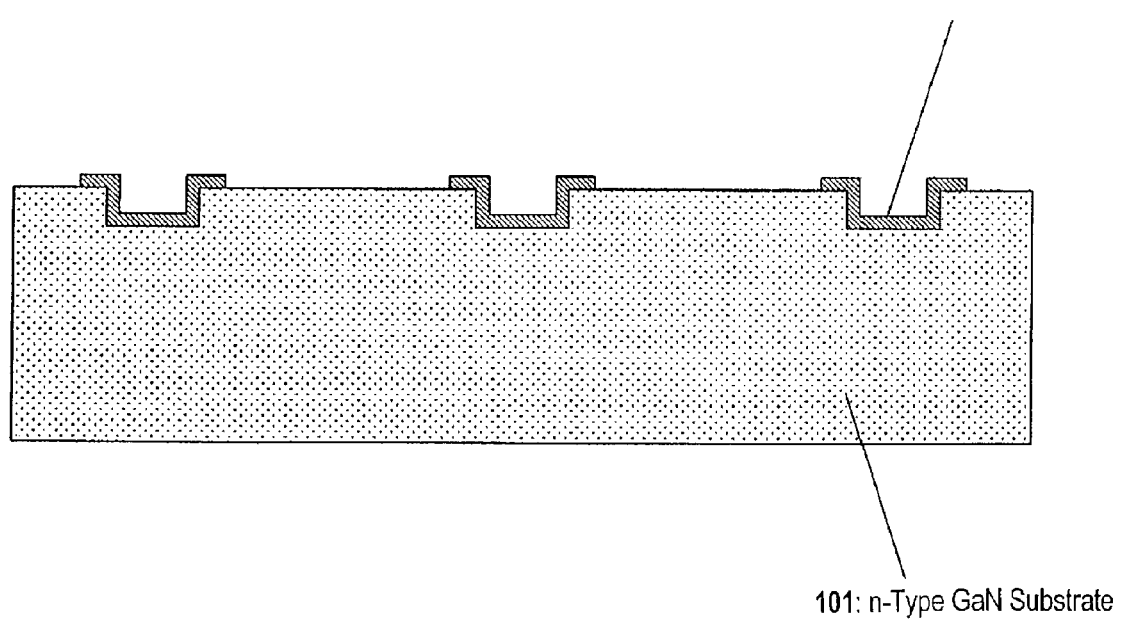
FIG. 4 is a cross-sectional view illustrating another processing step for fabricating the nitride semiconductor device shown in FIG. 1.

Subsequently, an insulating film 102 of silicon nitride is deposited on the principal surface of the substrate 101 by a sputtering process. The insulating film 102 may have an arbitrary thickness as long as the insulating film 102 can serve as a mask for selective growth. There is no need to consider the dielectric strength of the insulating film 102. In this preferred embodiment, the insulating film 102 is made of a silicon nitride film with a thickness of about 50 nm. Thereafter, by patterning the insulating film 102, openings are made through the insulating film 102 between the grooves 12 (i.e., over the raised portions on the principal surface of the substrate) as shown in FIG. 4. The raised portions of the substrate 101 are partially exposed through the openings. The grooves 12 are entirely covered with the insulating film 102. These openings have a striped planar shape, which is elongate in the resonant cavity length direction.

Figure 5:
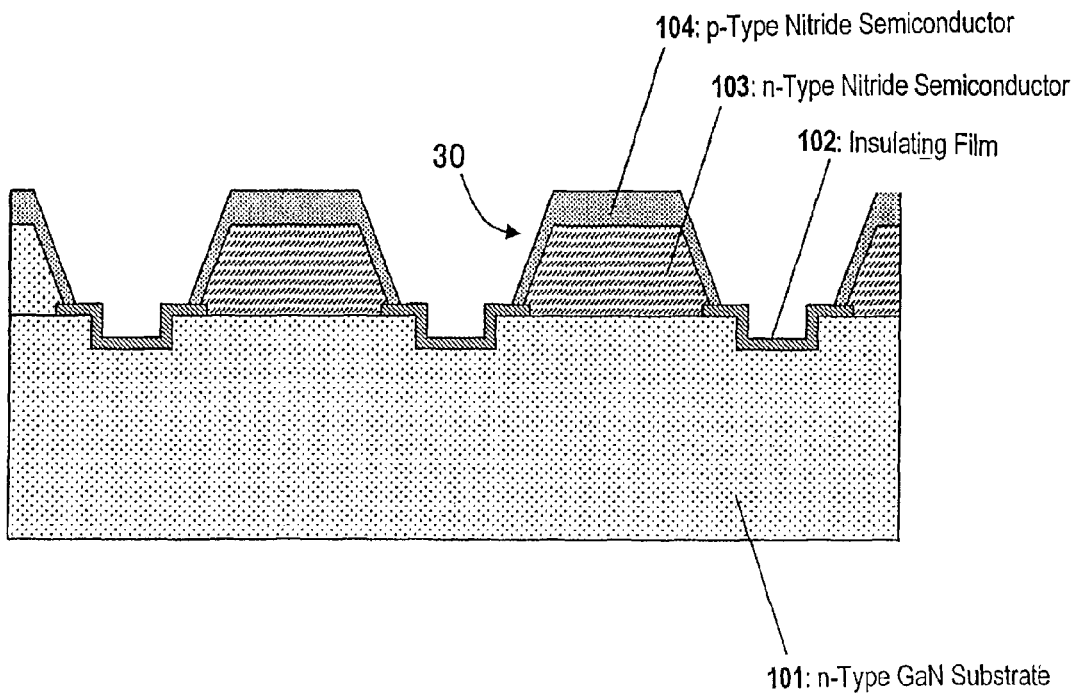
FIG. 5 is a cross-sectional view illustrating another processing step for fabricating the nitride semiconductor device shown in FIG. 1.

Next, as shown in FIG. 5, a nitride semiconductor multilayer structure 30 is formed by an MOCVD process. This multilayer structure 30 includes an n-type nitride semiconductor 103 and a p-type nitride semiconductor 104, which have been deposited in this order on the substrate 101. More specifically, the n-type nitride semiconductor 103 includes an n-$Al_{0.07}Ga_{0.93}N$ cladding layer and an n-GaN optical guide layer. On the other hand, the p-type nitride semiconductor 104 includes a multi-quantum well active layer, a p-GaN optical guide layer, a p-$Al_{0.07}Ga_{0.93}N$ cladding layer and a p-GaN layer. The respective semiconductor layers forming this multilayer structure 30 may be changed according to the type of the semiconductor laser to make.

The multilayer structure 30 is made up of a number of nitride semiconductor layers that have grown selectively from the opening of the insulating film 102. Due to the selective growth, the nitride semiconductors do not grow easily on the insulating film 102. That is why the thickness of the multilayer structure that has been formed over the opening of the insulating film 102 is greater than the thickness of the nitride semiconductors that have been deposited on the insulating film 102 (the latter thickness is zero in FIG. 5).

Figure 6:
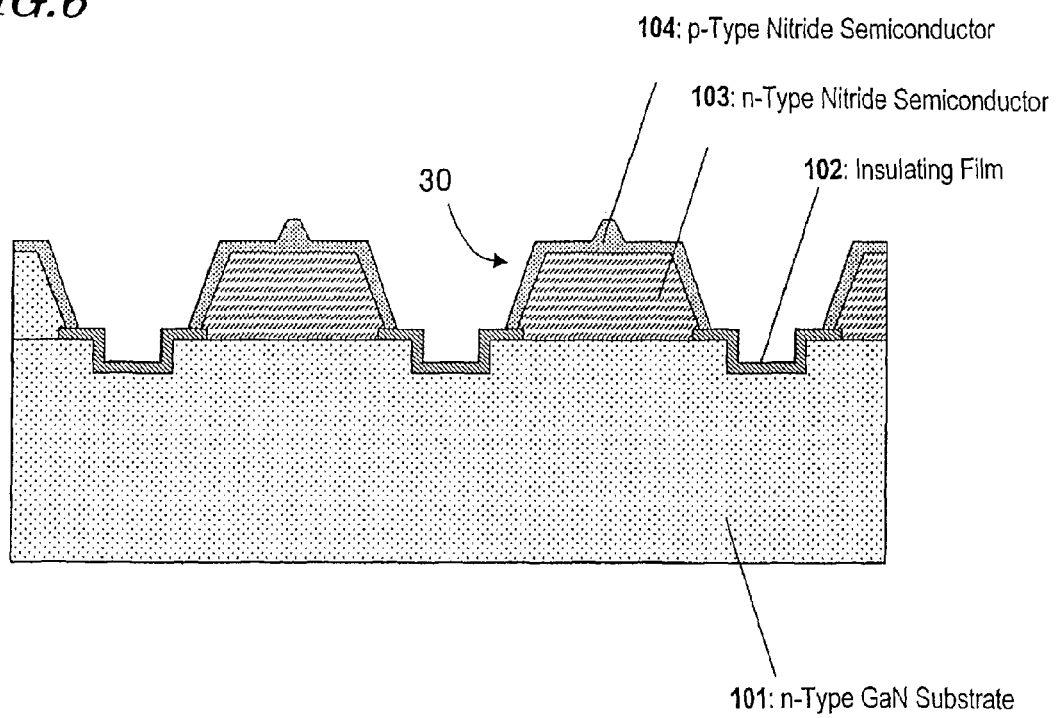
FIG. 6 is a cross-sectional view illustrating another processing step for fabricating the nitride semiconductor device shown in FIG. 1.
Figure 9:
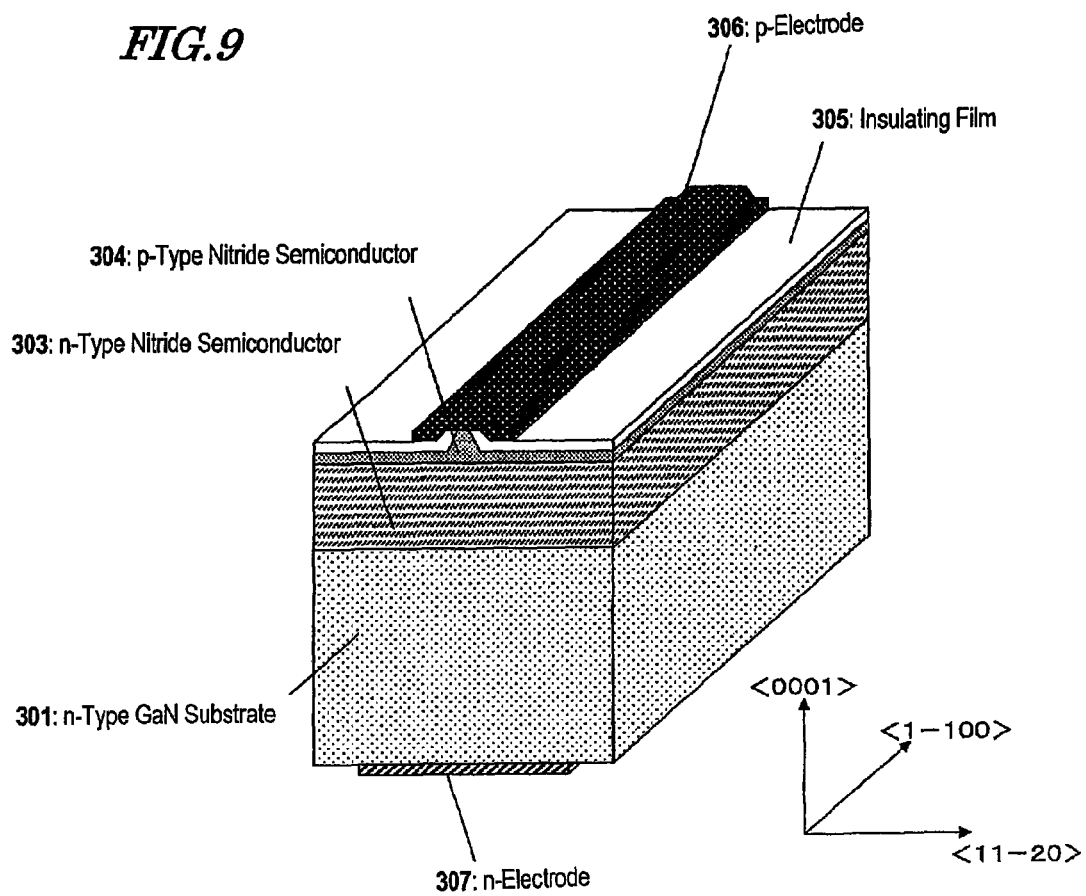
FIG. 9 is a perspective view illustrating the structure of a conventional nitride semiconductor laser.
Figure 10:
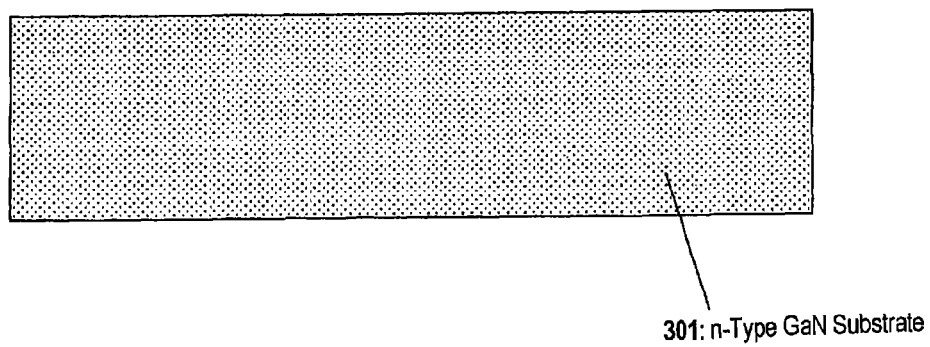
FIG. 10 is a cross-sectional view illustrating a processing step for fabricating the nitride semiconductor laser shown in FIG. 9.
Figure 11:
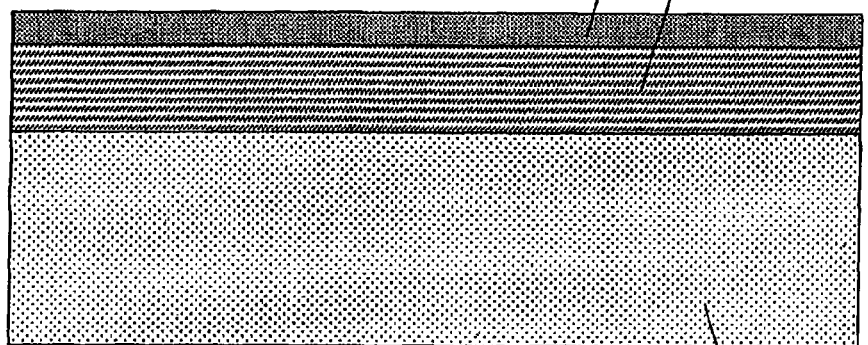
FIG. 11 is a cross-sectional view illustrating another processing step for fabricating the nitride semiconductor laser shown in FIG. 9.
Figure 12:
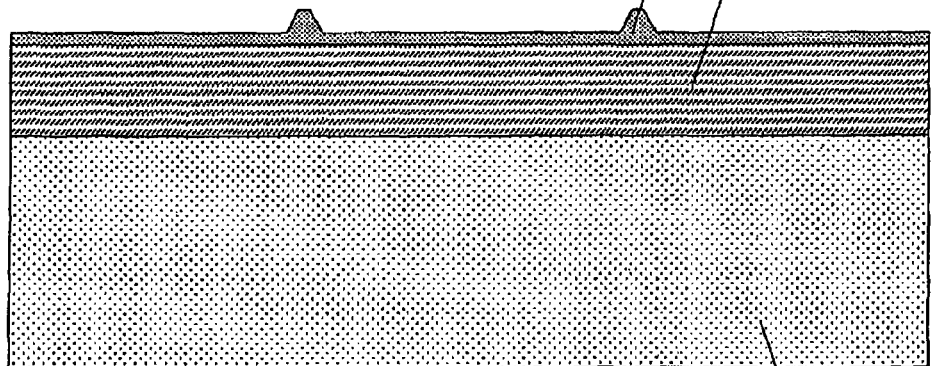
FIG. 12 is a cross-sectional view illustrating another processing step for fabricating the nitride semiconductor laser shown in FIG. 9.

Thereafter, as shown in FIG. 6, the p-type nitride semiconductor 104 is patterned into a ridge stripe shape with a width of about 2 μm. Next, as shown in FIG. 7, the ridge stripe is covered with an insulating film 105 on the right- and left-hand sides thereof, and then a current injection area is defined at the top of the ridge stripe. Subsequently, a p-electrode 106 consisting of Ni/Au, for example, is formed by a lift-off process so as to make contact with the surface of the p-type nitride semiconductor 104 that is exposed at the top of the ridge stripe. The back surface of the substrate 101 may be polished if necessary, and then an n-electrode 107 consisting of Ti/Al is formed thereon.

Thereafter, the substrate 101 is subjected to a first cleavage process in the <11-20> direction, thereby defining resonant cavity facets as (1-100) planes. The resonant cavity facets are parallel to the paper of FIG. 7. As a result of this first cleavage process, the single wafer is split into a lot of bars. In each of those bars, a plurality of devices are coupled in series together as shown in FIG. 7.

Next, portions of the substrate 101 with the grooves 12 are subjected to a second cleavage process in the <1-100> direction, which is perpendicular to the resonant cavity facets. In this manner, a number of devices that have been split into respective chips can be obtained as shown in FIG. 8. In FIG. 8, only three devices are illustrated. Actually, however, a lot of devices are cut out of a single bar. FIG. 8 illustrates these devices such that the (11-20) planes of each pair of adjacent devices, which have been exposed as a result of the second cleavage process, face each other.

The device shown in FIG. 1 is obtained by performing these processing steps. Each of those devices includes an associated device portion of the original single substrate 101 as a chip substrate.

The p-electrode 106 is preferably located only over the opening of the insulating film 102. In that case, no p-electrodes 106 will be present over the portions to be split into respective chips by the second cleavage process (i.e., the interdevice portions). Thus, failures such as peeled p-electrode are not caused easily as a result of this chip splitting.

Figure 13:
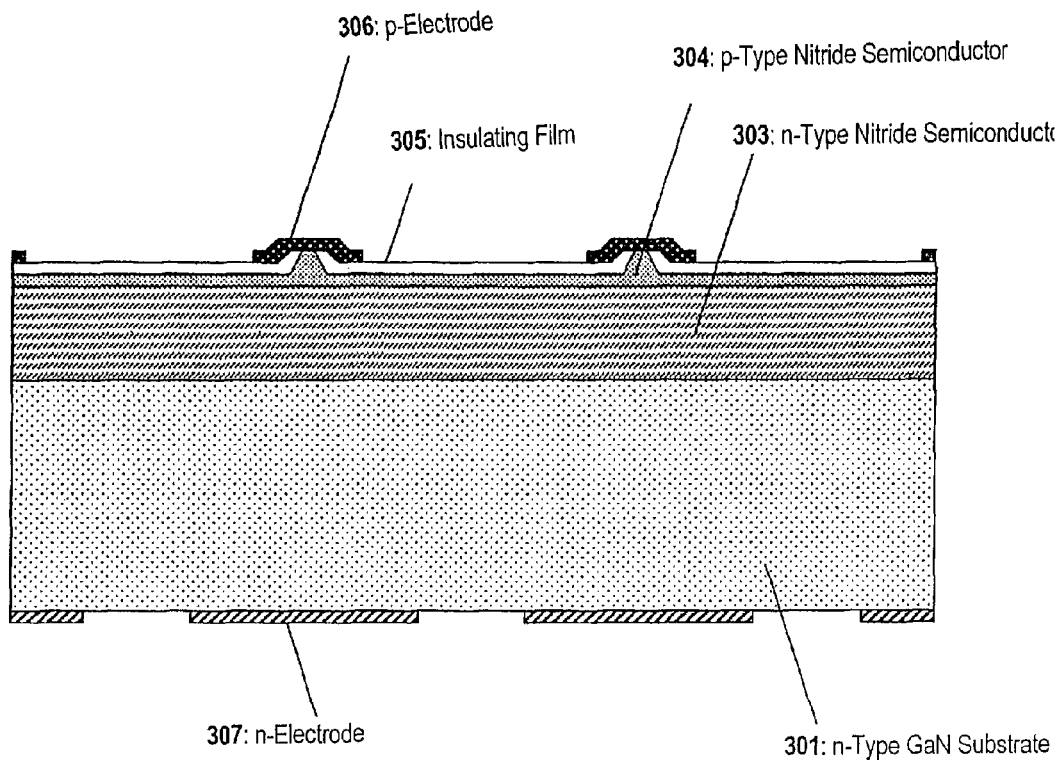
FIG. 13 is a cross-sectional view illustrating another processing step for fabricating the nitride semiconductor laser shown in FIG. 9.
Figure 14:
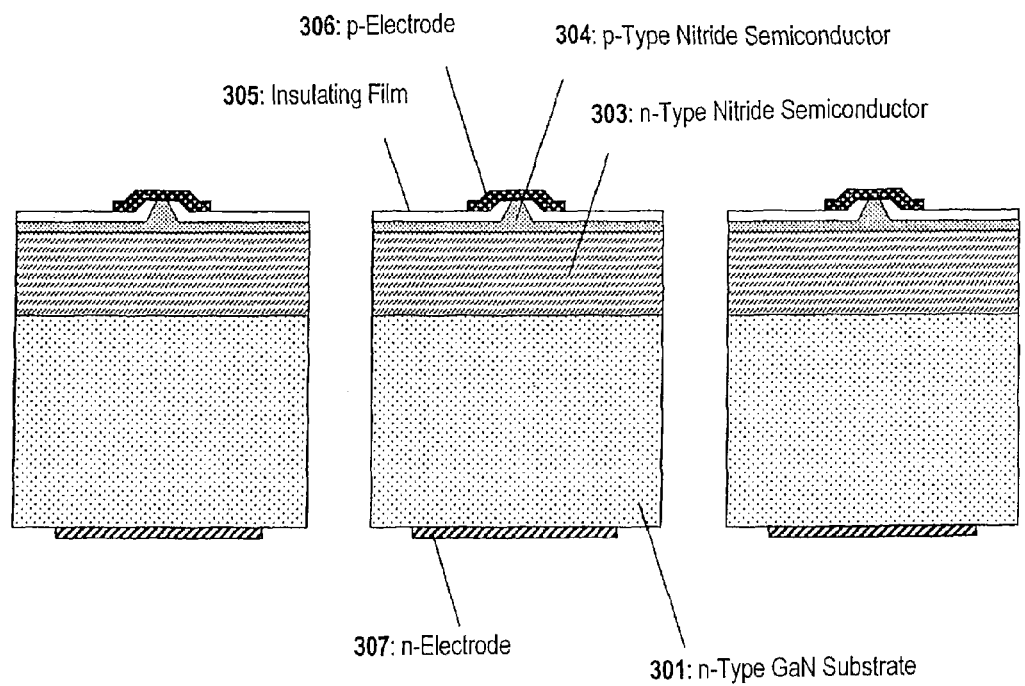
FIG. 14 is a cross-sectional view illustrating another processing step for fabricating the nitride semiconductor laser shown in FIG. 9.

In this preferred embodiment, groove gaps 40 are created between adjacent multilayer structures 30 so as to extend in the <1-100> direction as shown in FIG. 7, for example. In contrast, in the prior art, the multilayer structure is present all over the substrate 101, including those interdevice portions, as shown in FIG. 13, and there are no such groove gaps. The presence of these groove gaps 40 also contributes to facilitating the second cleavage in the <1-100> direction.

In this preferred embodiment, the grooves 12 are cut on the principal surface 10 of the substrate 101, thereby facilitating the second cleavage in the <1-100> direction. However, even without cutting those grooves 12 on the principal surface 10 of the substrate 101, the second cleavage process could be carried out in the <1-100> direction at a good yield thanks to the presence of those groove gaps 40 extending in the <1-100> direction. In that case, there would be no need to cut the grooves 12 on the principal surface of the substrate 101. Were it not for the grooves on the principal surface of the substrate 101, the selective growth should be carried out with increased selectivity and the thickness of the semiconductor layers deposited on the insulating film 102 should preferably be reduced sufficiently. However, if the substrate 101 has a thickness exceeding 100 μm, not only the groove gaps 40 but also the grooves 12 are preferably provided.

In the preferred embodiment described above, continuous grooves 12 are cut in the <11-20> direction, thereby making the average thickness of the interdevice portions of the substrate 101 smaller than that of the other portions thereof. Optionally, the grooves 12 may be replaced with a number of pit sequences. Also, those grooves or pit sequences may be made on the back surface of the substrate.

Industrial Applicability

The present invention significantly contributes to turning short-wave semiconductor lasers, which are expected to be applicable to the field of optical information processing, into mass-producible products. A nitride semiconductor substrate usually has a hexagonal crystal structure and is hard to cleave in the <1-100> direction. According to the present invention, however, a nitride semiconductor substrate, in which the average thickness of interdevice portions thereof is smaller than the thickness of device portions thereof, is used and nitride semiconductor multilayer structures are grown selectively on the device portions. Thus, the substrate can be cleaved easily along the interdevice portions. According to the present invention, nitride semiconductor devices can be mass-produced at a good yield using a nitride semiconductor substrate, thus making it possible to provide blue-ray semiconductor lasers and other short-wave light sources at reasonable prices.

The invention claimed is:

1. A semiconductor laser comprising:
a nitride semiconductor substrate with a striped raised portion that extends in a resonant cavity length direction;
a masking layer, which has been defined on the principal surface of the nitride semiconductor substrate and which has a striped opening in a selected area on the upper surface of the striped raised portion; and
a nitride semiconductor multilayer structure, which has been grown on the selected area on the upper surface of the striped raised portion,
wherein the nitride semiconductor multilayer structure is thicker than any nitride semiconductors that are grown on the masking layer,
the nitride semiconductor multilayer structure is broader in width than the striped opening of the masking layer and includes portions that have grown laterally onto the masking layer, and
wherein the composition of the raised portion of the nitride semiconductor substrate is the same as that of the nitride semiconductor substrate underlying the masking layer.

2. The semiconductor laser of claim 1, wherein the nitride semiconductor multilayer structure includes a p-type semiconductor layer and an n-type semiconductor layer.

3. The semiconductor laser of claim 1, wherein the substrate is a GaN based compound semiconductor substrate of which the upper surface is a (0001) plane, and
wherein resonant cavity facets thereof are (1-100) planes.

4. The semiconductor laser of claim 1, wherein the raised portion has a width of 50 μm to 500 μm, and
wherein the striped opening of the masking layer has a width of 30 μm to 480 μm, which is narrower than the width of the raised portion.

5. The semiconductor laser of claim 1, wherein the masking layer covers both side surfaces of the raised portion of the substrate.

6. The semiconductor laser of claim 1, wherein the surface of the nitride semiconductor substrate has a raised portion and a lower portion, and a level difference therebetween; the raised portion having a right- and a left-hand side, and the level differences on the right- and left-hand sides of the raised portion on the principal surface of the nitride semiconductor substrate have a height of at least 0.1 μm.

* * * * *